(12) United States Patent
Ravi et al.

(10) Patent No.: US 10,847,421 B2
(45) Date of Patent: Nov. 24, 2020

(54) SEMICONDUCTOR LAYER SEPARATION FROM SINGLE CRYSTAL SILICON SUBSTRATE BY INFRARED IRRADIATION OF POROUS SILICON SEPARATION LAYER

(71) Applicant: Svagos Technik, Inc., Santa Clara, CA (US)

(72) Inventors: Tirunelveli S. Ravi, Saratoga, CA (US); Stephen Daniel Miller, San Jose, CA (US)

(73) Assignee: Svagos Technik, Inc., Santa Clara, CA (US)

( * ) Notice: Subject to any disclaimer, the term of this patent is extended or adjusted under 35 U.S.C. 154(b) by 0 days.

(21) Appl. No.: 15/630,277

(22) Filed: Jun. 22, 2017

(65) Prior Publication Data

US 2017/0372966 A1 Dec. 28, 2017

Related U.S. Application Data

(60) Provisional application No. 62/354,663, filed on Jun. 24, 2016.

(51) Int. Cl.
| | |
|---|---|
| *H01L 21/78* | (2006.01) |
| *H01L 21/263* | (2006.01) |
| *C30B 33/06* | (2006.01) |
| *H01L 21/304* | (2006.01) |
| *C30B 25/18* | (2006.01) |
| *C30B 29/06* | (2006.01) |
| *H01L 21/02* | (2006.01) |

(52) U.S. Cl.
CPC ........ *H01L 21/7813* (2013.01); *C30B 25/186* (2013.01); *C30B 29/06* (2013.01); *C30B 33/06* (2013.01); *H01L 21/0245* (2013.01); *H01L 21/0262* (2013.01); *H01L 21/02381* (2013.01); *H01L 21/02513* (2013.01); *H01L 21/02532* (2013.01); *H01L 21/263* (2013.01); *H01L 21/2636* (2013.01); *H01L 21/304* (2013.01)

(58) Field of Classification Search
CPC combination set(s) only.
See application file for complete search history.

(56) References Cited

U.S. PATENT DOCUMENTS

| | | | |
|---|---|---|---|
| 8,101,531 B1* | 1/2012 | Li | C23C 16/045 257/E21.576 |
| 2006/0057820 A1* | 3/2006 | Yamanaka | H01L 27/14618 438/458 |
| 2006/0281235 A1 | 12/2006 | Tayanaka | |

(Continued)

FOREIGN PATENT DOCUMENTS

| | | |
|---|---|---|
| EP | 087920 A2 | 9/1998 |
| JP | 2005-101630 A | 4/2005 |

OTHER PUBLICATIONS

International Search Report and Written Opinion dated Oct. 13, 2017, in PCT/US2017/038717.

*Primary Examiner* — Erin F Bergner
(74) *Attorney, Agent, or Firm* — Pillsbury Winthrop Shaw Pittman LLP

(57) ABSTRACT

Methods and equipment for the removal of semiconductor wafers grown on the top surface of a single crystal silicon substrate covered by a porous silicon separation layer by using IR irradiation of the porous silicon separation layer to initiate release of the semiconductor wafer from the substrate, particularly at edges (and corners) of the top surface of the substrate.

34 Claims, 10 Drawing Sheets

SECTION X-X

(56) References Cited

U.S. PATENT DOCUMENTS

| | | | |
|---|---|---|---|
| 2012/0003815 A1 | 1/2012 | Lee | |
| 2014/0038392 A1* | 2/2014 | Yonehara | H01L 21/304 438/463 |
| 2015/0031215 A1* | 1/2015 | Mahoney | H01L 21/6836 438/759 |

* cited by examiner

SECTION X-X

SEMICONDUCTOR LAYER SEPARATION FROM SINGLE CRYSTAL SILICON SUBSTRATE BY INFRARED IRRADIATION OF POROUS SILICON SEPARATION LAYER

RELATED APPLICATIONS

This application claims priority from U.S. provisional application Ser. No. 62/354,663 filed Jun. 24, 2016. The disclosure of this application is incorporated herein by reference.

FIELD OF THE INVENTION

The present invention relates generally to methods and equipment for separating semiconductor structures from a silicon substrate comprising IR irradiation of a porous silicon separation layer.

BACKGROUND

There is a need for tools and methods for efficient and low cost separation of semiconductor structures at high yield from a silicon substrate using a porous silicon separation layer. Furthermore, there is a need for such tools and methods for producing a clean, undamaged silicon substrate that can be reused for fabricating more semiconductor structures without negatively affecting process yield during reuse.

SUMMARY OF THE INVENTION

Some embodiments of the present invention relate generally to methods and equipment for the removal of semiconductor wafers grown on the top surface of a single crystal silicon substrate covered by a porous silicon separation layer by using IR irradiation of the porous silicon separation layer to initiate release of the semiconductor wafer from the substrate, particularly at edges (and corners) of the top surface of the substrate.

According to some embodiments, a method of fabricating a semiconductor wafer may comprise: providing a single crystal silicon substrate, the single crystal silicon substrate having top and bottom surfaces and at least one side surface, the single crystal silicon substrate having a porous silicon separation layer on the surface of the single crystal silicon substrate over at least the entire top surface of the single crystal silicon substrate and a semiconductor layer on the surface of the porous silicon separation layer, the semiconductor layer not extending beyond the porous silicon separation layer; irradiating at least a portion of the porous silicon separation layer with light with wavelength in the range of 1.5 microns to 11.0 microns to initiate a separation of the semiconductor layer from the single crystal silicon substrate; and mechanically separating the semiconductor layer completely from the single crystal silicon substrate. Furthermore, in embodiments, before the irradiating, applying an infrared absorbing material to a portion of an exposed surface of said semiconductor layer. Furthermore, in embodiments further comprising, after the mechanically separating, reusing the single crystal silicon substrate for fabricating another semiconductor wafer.

According to some embodiments, a system for separating a semiconductor wafer from a single crystal silicon substrate with a porous silicon separation layer may comprise: an irradiation tool for irradiating at least a portion of the porous silicon separation layer with light with wavelength in the range of 1.5 microns to 11.0 microns to initiate a separation of a semiconductor layer from the substrate; and a mechanical separation tool for mechanically separating the semiconductor layer completely from the substrate. Furthermore, in embodiments the system further comprises a conveyor for transporting the single crystal silicon substrate through the irradiation tool and the mechanical separation tool. Furthermore, in embodiments the system further comprises an applicator for the application of an infrared absorbing material to a portion of an exposed surface of the semiconductor layer.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Figure 1:
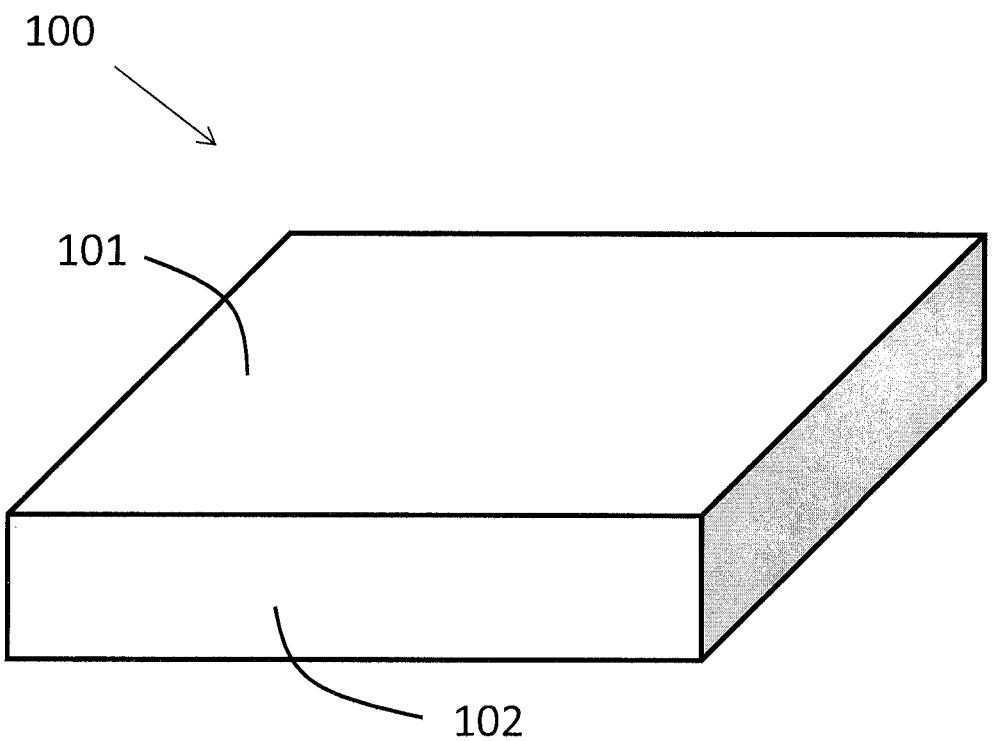
FIG. 1 shows a representation of a single crystal silicon substrate as provided in some embodiments of the present invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

When a semiconductor wafer, such as a silicon wafer, is epitaxially grown on a silicon template formed on the top surface of a porous silicon separation layer on a single crystal silicon substrate the silicon wafer needs to be removed without cracking or breaking. Furthermore, in order to reuse the silicon substrate, the porous silicon separation layer and any remnants of the epitaxially deposited semiconductor wafer need to be removed without damaging the single crystal silicon substrate in order to permit reuse of the substrate without yield loss for the growth of more semiconductor wafers. According to embodiments of the present invention a process for clean removal of the semiconductor wafer, including parts of the semiconductor layer that formed on side surfaces of the substrate, includes IR irradiation of the porous silicon separation layer on the side surfaces of the substrate—the IR radiation is strongly absorbed by the porous silicon separation layer, while the semiconductor layer and silicon substrate absorb very little of the energy of the IR radiation.

The primary role of the IR irradiation of the porous silicon layer is to initiate release of the semiconductor layer from the substrate where it covers the sides of the substrate and particularly edges and corners of the top surface of the substrate. (The inventors discovered that it is at the edges and corners of the substrate that the semiconductor layer is most difficult to release from the substrate.) Typical issues with the substrate include epitaxial silicon layers being attached to the substrate most often along the edges and at the corners of the substrate too tightly so as not to be removable even by vigorous chemical reaction. The remaining epitaxial silicon left behind on the substrate may render the substrate unusable after only a few reuses. The IR irradiation process described herein has been found to be effective at releasing the semiconductor layer along edges and at corners of the substrate, thus eliminating the need for lower yield processes which include mechanical or laser scribing around the edge of the top surface of the semiconductor layer prior to mechanical separation of the semiconductor wafer from the porous silicon covered substrate.

IR irradiation by the processes described herein improves the removal of the semiconductor layer and is expected to improve the yield of the following parts of the process for growing semiconductor wafers: (1) improved yield of semiconductor wafers without cracking or breakage; and (2) improved yield of reusable substrates, without residual semiconductor material on the surfaces or damage to the substrate surface, particularly around the edges and corners of the top surface of the substrate.

Figure 11:
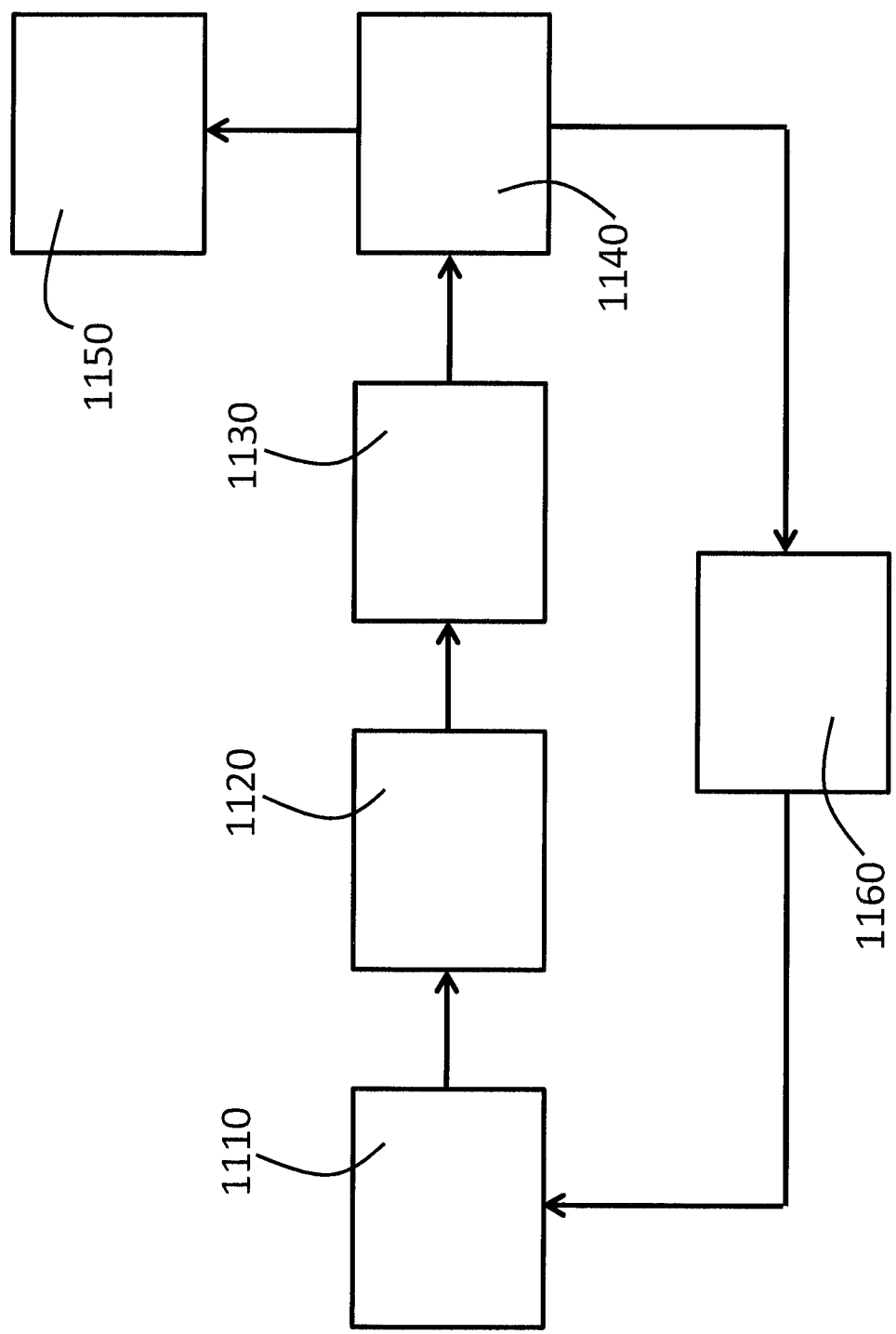
FIG. 11 is a schematic representation of a process line for the growth of semiconductor layers and separation of these semiconductor layers from a single crystal silicon substrate, according to some embodiments of the present invention.
Figure 12:
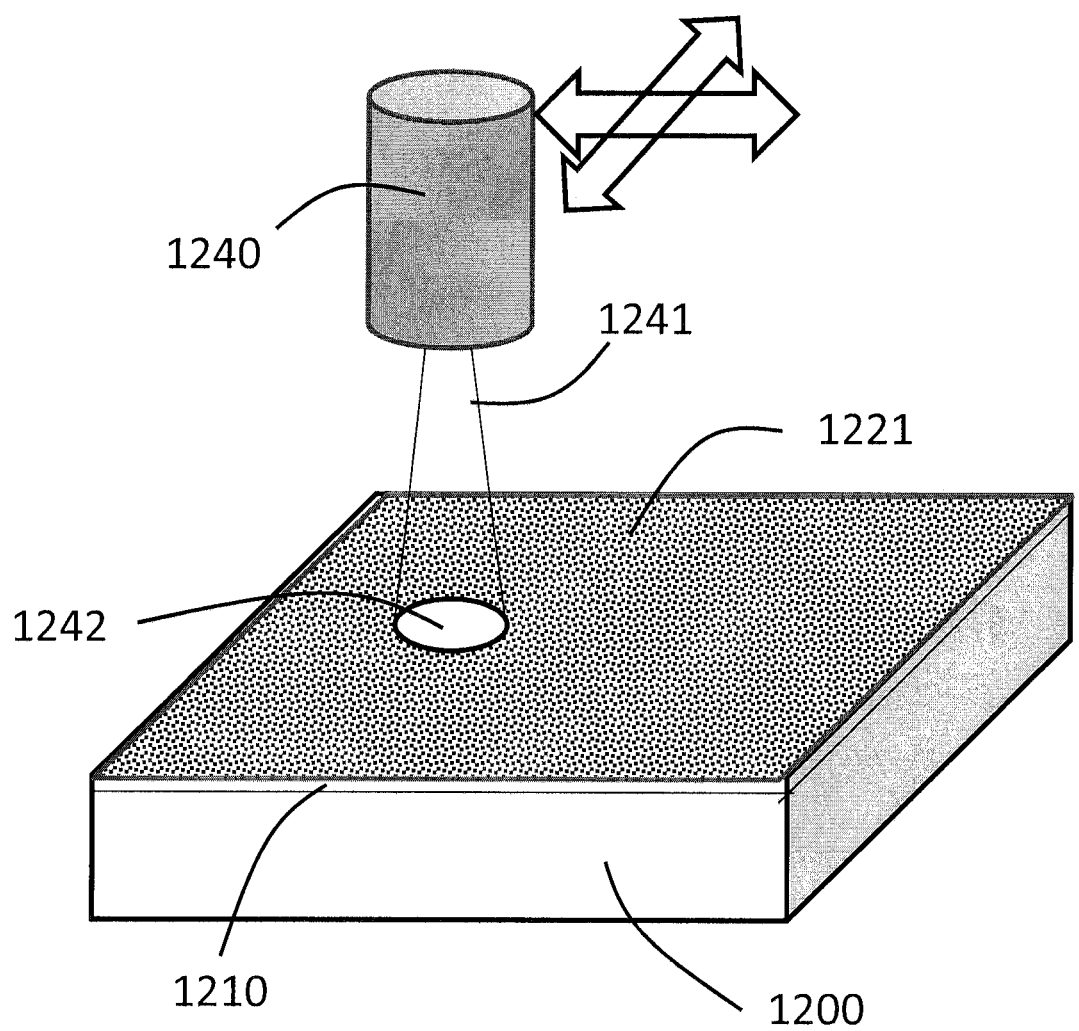
FIG. 12 is schematic representation of infrared laser irradiation of a porous semiconductor layer on the surface of a semiconductor substrate for initiation of the separation of a deposited layer from a semiconductor substrate, according to a further embodiment of the present invention.

FIGS. 1, 2, 3, 4A and 4B show an example of the formation process of a single crystal silicon substrate with a porous silicon separation layer on which is deposited a semiconductor layer, and optional areas of IR absorbing material are applied to the surface of the semiconductor layer where the semiconductor layer is deposited over the separation layer on the sides of the substrate. FIGS. 5, 6, 7, 8 9 & 10 show examples of separation of the semiconductor layer from the single crystal silicon substrate, the separation being assisted by IR irradiation of the porous silicon separation layer. FIG. 11 shows a schematic illustration of a process line according to some embodiments of the present invention, where the separation of the semiconductor layers formed on single crystal silicon substrates is assisted by IR irradiation of the porous silicon separation layer, and wherein the single crystal silicon substrates are cleaned up and reused tens, or even hundreds of times in the semiconductor layer fabrication process. FIG. 12 shows an example of infrared laser irradiation of a porous semiconductor layer on the surface of a semiconductor substrate for initiation of the separation of a deposited layer from a semiconductor substrate, according to a further embodiment of the present invention.

FIG. 1 shows a representation of a single crystal silicon substrate 100 as provided in some embodiments of the present invention. The substrate 100 has a top surface 101 and four side surfaces 102. The substrate 100 in some embodiments is cuboid, having a total of six rectangular surfaces, where each surface is perpendicular to adjoining surfaces, although other substrate configurations may also be used—for example, a circular substrate with parallel top and bottom surfaces and a side surface perpendicular to the top and bottom surfaces extending around the perimeter. (In the case of a circular substrate the perimeter may be circular or circular with one or more flats—as is well known for silicon wafers in the semiconductor industry.)

Figure 2:
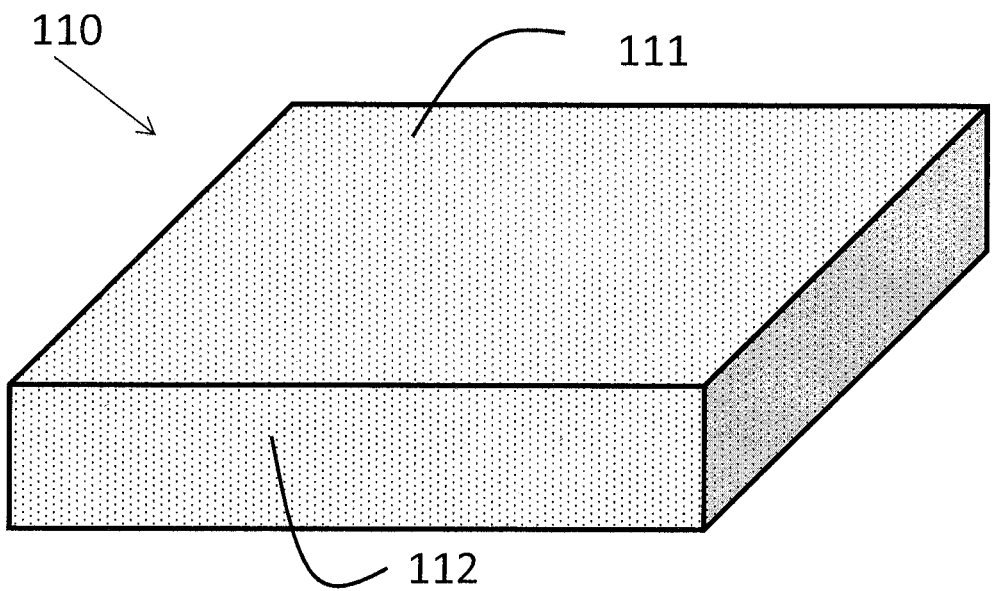
FIG. 2 shows a representation of a porous silicon separation layer as formed on the single crystal silicon substrate of FIG. 1, according to some embodiments of the present invention.

FIG. 2 shows a representation of a porous silicon separation layer 110 as formed on the single crystal silicon substrate of FIG. 1, according to some embodiments of the present invention. The porous silicon separation layer 110 is a continuous layer comprising a porous silicon top layer 111 covering the top surface 101 of the substrate 100, and four porous silicon side surface layers 112 which extend over each of the side surfaces of the single crystal silicon substrate, and wrap onto the back surface of the substrate. The porous silicon separation layer 110 extends continuously over the edge of the top surface 101 of the single crystal silicon substrate 100 to connect with the porous silicon side surface layers 112, as shown in FIG. 2. The porous silicon separation layer can be formed by an anodization process in a hydrofluoric acid electrolyte; the porosity through the thickness of the separation layer can be tailored (from more porous to less porous from through the thickness of the layer starting at the substrate); the porous silicon layer can be annealed in a hydrogen atmosphere to form an improved top surface for growth of an epitaxial single crystal silicon semiconductor layer. Formation of the porous silicon separation layer may be by a process such as described in U.S. Patent Appl. Publ. No. 2013/0032084 for Silicon Wafers by Epitaxial Growth, incorporated by reference in its entirety herein.

Figure 3:
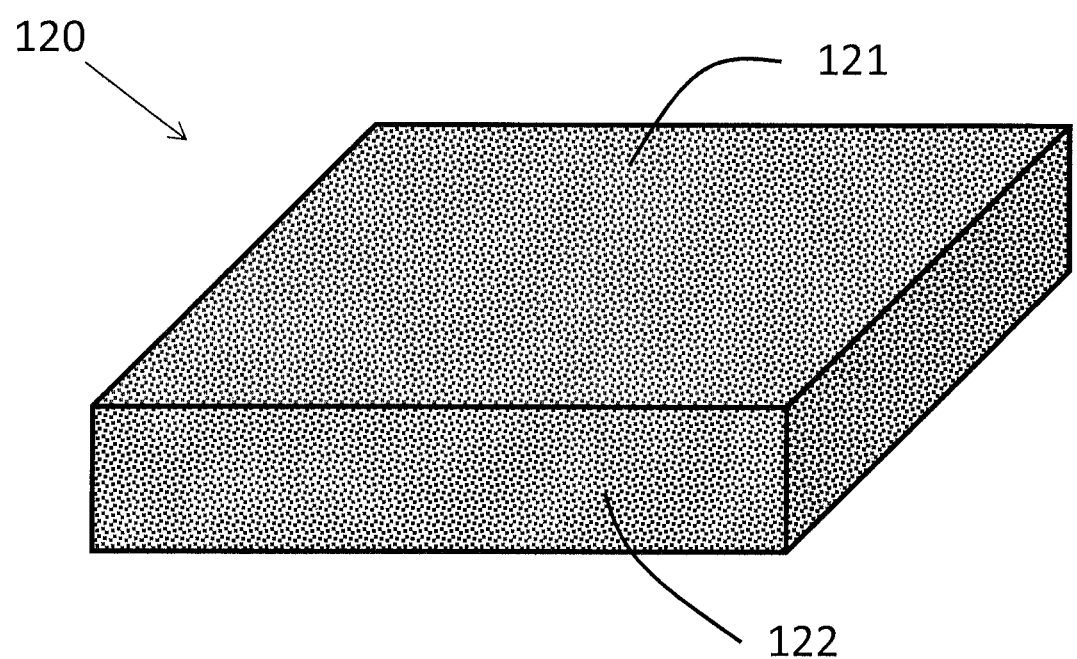
FIG. 3 shows a representation of a semiconductor layer formed on the porous silicon separation layer of FIG. 2, according to some embodiments of the present invention.

FIG. 3 shows a representation of a semiconductor layer 120 formed on the porous silicon separation layer 110 of FIG. 2, according to some embodiments of the present invention. The semiconductor layer 120 is a continuous layer comprising a semiconductor top layer 121 covering the porous silicon top layer 111, and four semiconductor side surface layers 122 which extend at least partially over the four corresponding porous silicon side surface layers 112. The semiconductor layer 120 extends continuously over the edge of the porous silicon top layer 111 and the semiconductor side surface layers 122, as shown in FIG. 3. The porous silicon separation layer 110 extends underneath the entire semiconductor layer 120, and importantly the porous silicon separation layer 110 extends beyond the semiconductor layer 120 on all side surfaces of the substrate, so as to ensure that there is no deposition of semiconductor material directly on to the substrate side surfaces. The semiconductor layer may be formed on the surface of the porous silicon separation layer by a deposition process such as chemical vapor deposition in a reactor such as described in U.S. Patent Appl. Publ. No. 2013/0032084 for Silicon Wafers by Epitaxial Growth, incorporated by reference in its entirety herein. In embodiments the semiconductor layer is an epitaxial single crystal silicon layer.

Figure 4A:
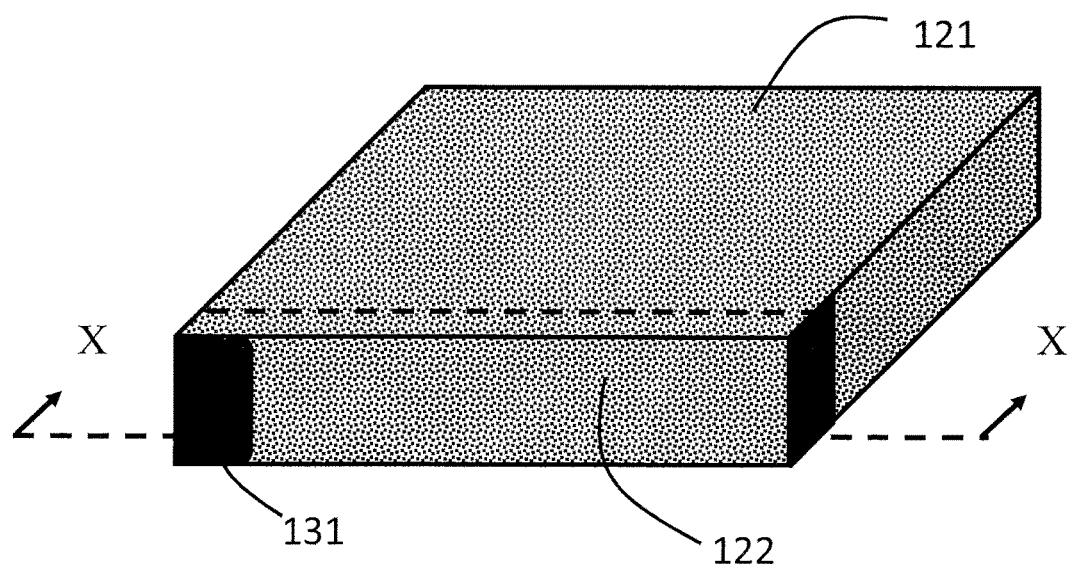
FIGS. 4A & 4B show perspective and cross-sectional representational views, respectively, of the structure of FIG. 3 with areas of infrared absorbing material applied to the side surfaces of the semiconductor layer, according to some embodiments of the present invention.
Figure 4B:
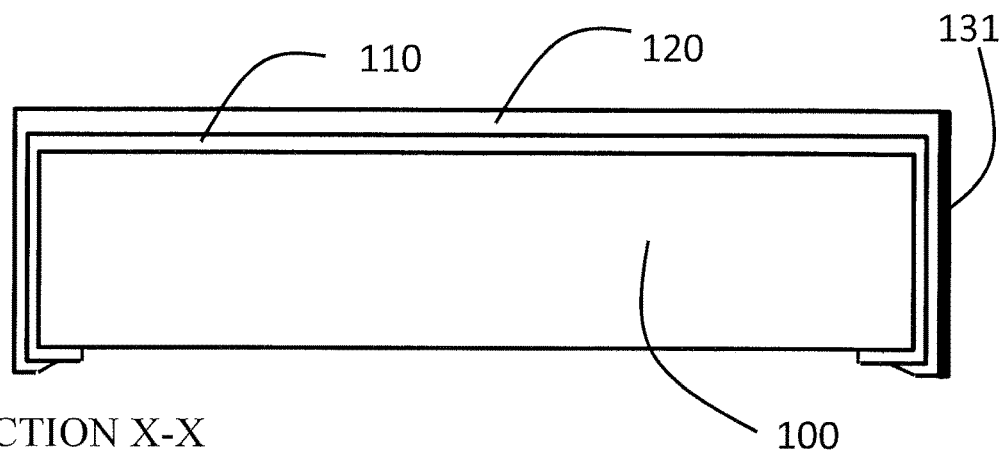

FIGS. 4A & 4B show perspective and cross-sectional representational views, respectively, of the structure of FIG. 3 with areas of infrared absorbing material 131 applied to the side surfaces 122 and edges/corners of the semiconductor layer 120, according to some embodiments of the present invention. Note that in some embodiments there is no infrared absorbing material. The infrared absorbing material is applied in some embodiments to a portion of the exposed surface of the semiconductor, wherein the absorbing material is a single area on each of the side surfaces of the semiconductor layer. The infrared absorbing material in some embodiments comprises a material chosen from the group consisting of organic dye compounds and inorganic particulates. A mechanism may be used for applying the areas of die as the coated substrate moves towards IR lasers, as described in more detail below. In other embodiments (not shown), the infrared absorbing material may be applied to the top surface 121 of the semiconductor layer 120, in areas close to the edge of the substrate for example.

Figure 5:
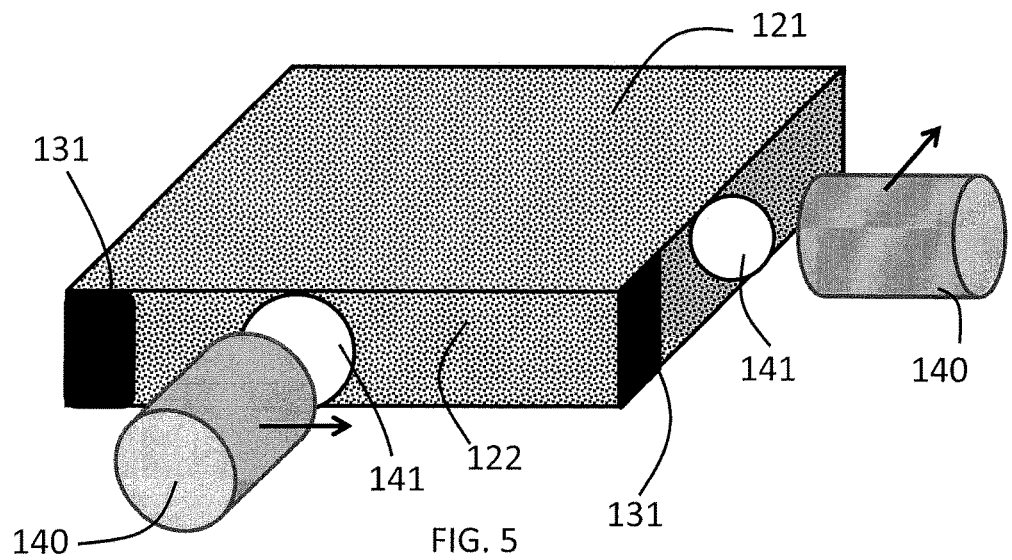
FIG. 5 shows a schematic representation of infrared laser irradiation of the device of FIGS. 4A & 4B for initiation of the separation of the semiconductor layer from the single crystal silicon substrate, according to a first embodiment of the present invention.

FIG. 5 shows a schematic representation of infrared light irradiation of the device of FIGS. 4A & 4B for initiation of the separation of the semiconductor layer from the single crystal silicon substrate by selectively depositing light energy in the porous silicon layer, according to a first embodiment of the present invention. The irradiation in some embodiments is irradiation incident roughly perpendicularly to one of the side surfaces 122 of the semiconductor layer, where the irradiation is through the semiconductor layer, and wherein the semiconductor layer has high optical transmittance for light with wavelengths in the range of 1.5 microns to 11.0 microns, wherein the optical transmittance if greater than 90 percent, and in embodiments greater than 95 percent. In other embodiments the irradiation may be at an angle to the side surfaces of the semiconductor layer—typically an angle between 10 and 20 degrees from the perpendicular, and in some embodiments an angle of roughly 14 degrees is preferred—see FIG. 7. In yet further embodiments the irradiation may be roughly perpendicular to the top surface of the substrate, along the edge of the substrate, and in embodiments at an angle of between 10 and 20 degrees from the perpendicular. In some embodiments (not shown) the irradiating is through the single crystal silicon substrate—this can be achieved using wavelengths in the IR which are not strongly absorbed by the silicon substrate, but which are strongly absorbed in the porous silicon layer.

In embodiments the IR irradiation is laser light 141 from an IR laser 140, in embodiments a beam diameter of the laser used for the irradiating is in the range of 100 microns to 2 millimeters, in embodiments the laser light irradiating is continuous wave laser light irradiating, and in embodiments the laser light irradiating is pulsed wave laser light irradiating. In some embodiments the irradiating starts at the infrared absorbing material 131 and moves away from the infrared absorbing material, as indicated by the position of the IR lasers 140 and the direction of movement of the lasers indicated by the arrows. (Note that either the IR light source or the substrate can be moved or a combination of both.) The infrared absorbing material when irradiated by IR absorbs more of the IR radiation than surrounding areas and leads to a "hot spot" at the site of the dot of IR absorbing material; the hot spot may create sufficient stress between the substrate, the separation layer and the semiconductor layer so that the separation layer suffers structural failure and releases the semiconductor layer from the substrate; once the structural failure of the separation layer has been initiated it requires less energy to propagate the structural failure which can be done by moving the IR irradiation along the side surface in order to release the entire side surface 122 of the semiconductor layer. Furthermore, it is important to note that the porous silicon layer is strongly absorbing of the IR light, when compared with the silicon substrate and semiconductor layer, and a dose of IR radiation sufficient to weaken the porous silicon layer and assist in separation does not cause any damage to the silicon substrate, thus permitting reuse of the silicon substrate with high yield. In some embodiments all side surfaces of the substrate are irradiated—the IR light being absorbed by portions of the side surface layers of the porous silicon separation layer—using multiple lasers serially or in parallel, or in embodiments using only a single laser. In embodiments the irradiating is with light within a wavelength range from 1.9 microns to 2.1 microns, in embodiments within a wavelength range from 1.9 microns to 6.0 microns, in embodiments within a wavelength range from 4.9 microns to 6.0 microns, and in embodiments within a wavelength range from 9.0 microns to 10.5 microns. (These wavelength ranges correspond to a thulium fiber laser, a mid-IR fiber laser, a CO laser and a $CO_2$ laser, respectively.) The power of an IR laser and the number of IR lasers may be chosen to provide a desirable throughput of substrates per hour. For example, a single 90 Watt IR laser may be sufficient to initiate release of the semiconductor layer in only approximately 2 or 3 seconds per edge for a 200 mm substrate. Furthermore, due to the large permissible beam diameter (greater than 1 mm) and large depth of focus (greater than 2 mm) precise alignment between the laser and the substrate is not needed.

The inventors theorize that when a pulsed laser is used in the methods described herein, the heat preferentially absorbed in the porous silicon layer creates a shock wave that emanates from the site of the laser exposure and the shock wave disrupts the porous silicon structure thus initiating the separation of the semiconductor layer from the silicon substrate. Furthermore, the inventors theorize that when a CW (continuous wave) laser is used in the methods described herein, the heat preferentially absorbed in the porous silicon layer is sufficient to vaporize the porous silicon layer and the forces on the semiconductor layer due to the hot gases generated are sufficient to physically separate the semiconductor layer from the substrate. Furthermore, the inventors theorize that the initial absorption of IR by the porous silicon layer leads to heating of the layer, which has the effect of changing the porous silicon bandgap which in turn increases the absorption of IR light by the porous silicon layer. It is noted that the addition of some IR absorbing material to the outside surface of the semiconductor layer may have a similar effect of locally heating the porous silicon layer below the dot of IR absorbing material, and thus increasing the absorption of IR by the porous silicon layer. The inventors explain a desirable IR radiation dose rate is one that is sufficient to damage the porous silicon layer to release the epitaxial semiconductor layer while avoiding too much heat absorption in the porous silicon such that the temperature of the silicon substrate is locally increased to change the bandgap and increase the absorption of IR radiation by the substrate to the point where the substrate may be damaged. Furthermore, the semiconductor layer should also be protected from heat damage—this layer needs to remain effectively transparent to IR radiation and therefore should not be heated to the point where the absorption of IR radiation could result in damage to the layer.

Figure 6:
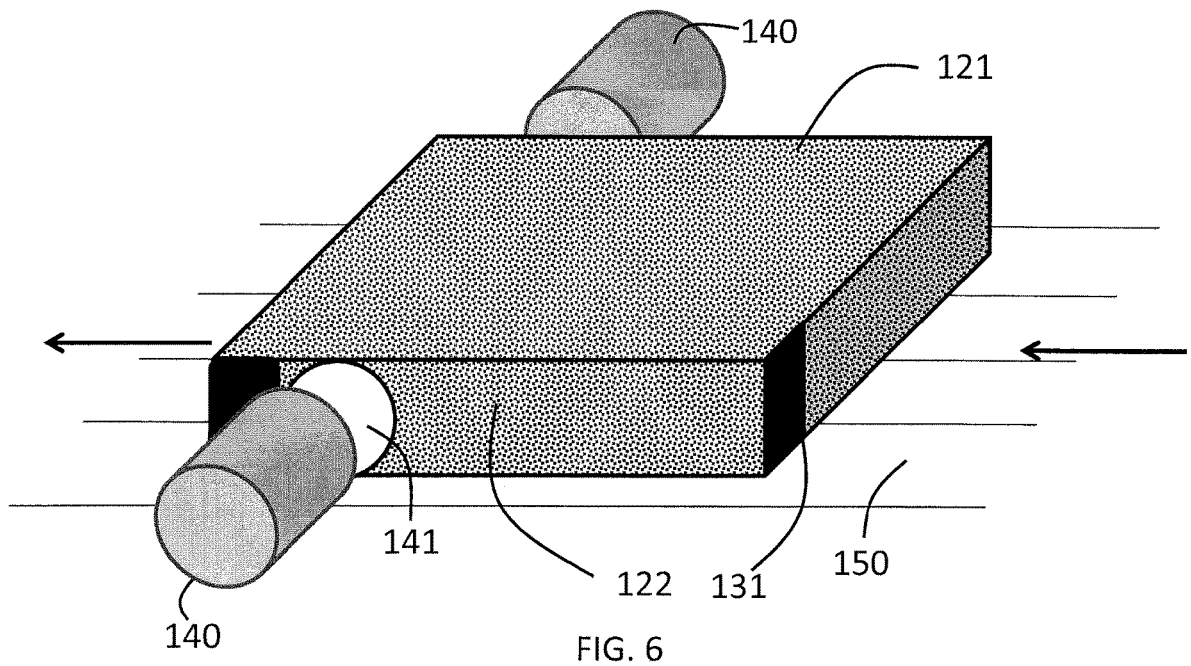
FIG. 6 shows a schematic representation of infrared laser irradiation of the device of FIGS. 4A & 4B for initiation of the separation of the semiconductor layer from the single crystal silicon substrate, according to a second embodiment of the present invention.
Figure 8:
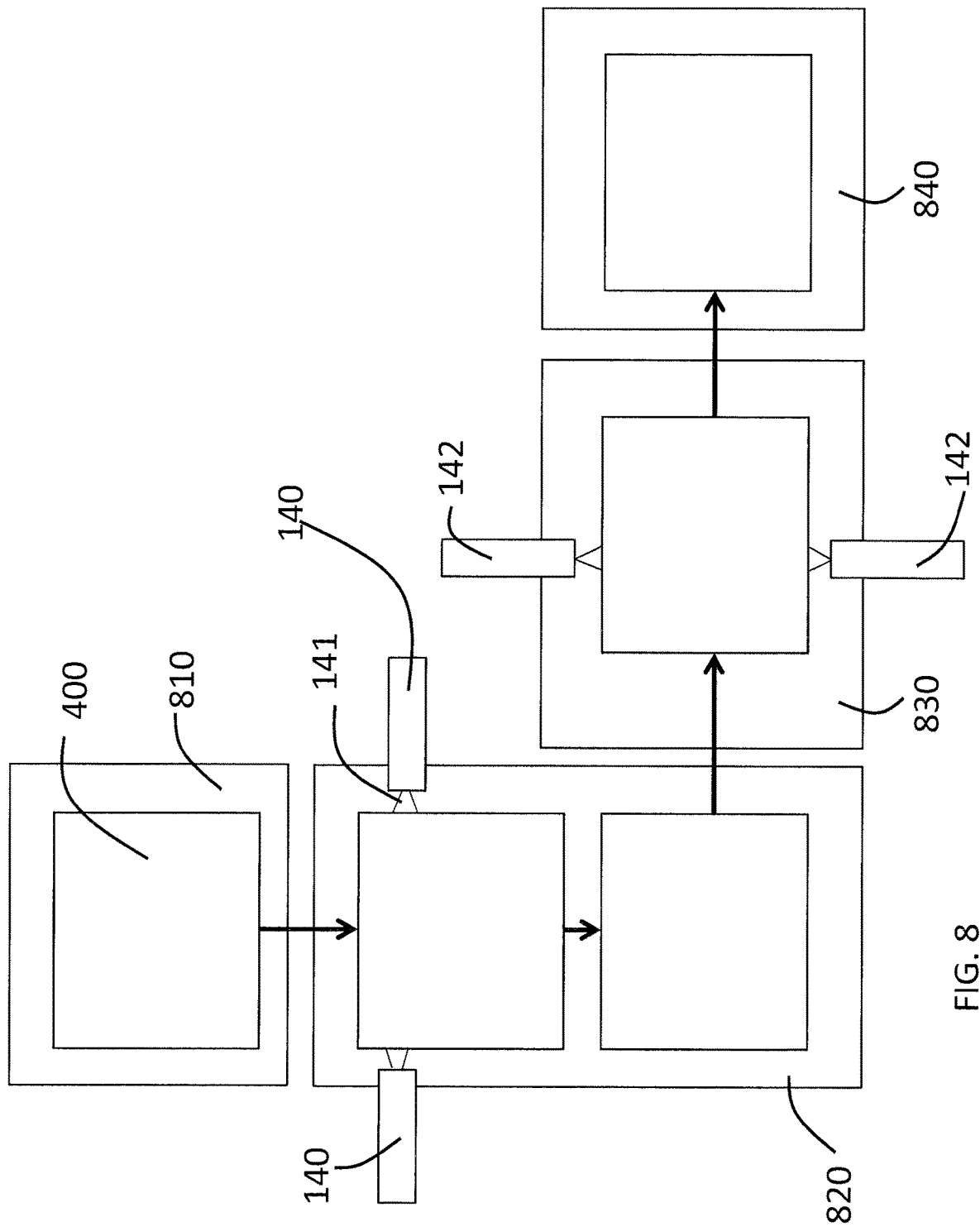
FIG. 8 shows a schematic representation of a tool set for infrared laser irradiation of the device of FIGS. 4A & 4B for initiation of the separation of the semiconductor layer from the single crystal silicon substrate, according to some embodiments of the present invention.

FIG. 6 shows a schematic representation of infrared laser irradiation of the device of FIGS. 4A & 4B for initiation of the separation of the semiconductor layer from the single crystal silicon substrate, according to a second embodiment of the present invention. In this embodiment the irradiation is simultaneous laser light irradiation of the porous silicon side surface layers 112 through side surfaces of the semiconductor layer over parts of first opposite side surfaces of a substantially rectangular silicon substrate. After the laser light irradiation of first opposite sides, simultaneous laser light irradiation of the porous silicon side surface layers 112 through side surfaces of the semiconductor layer on second opposite sides of a substantially rectangular silicon substrate is done, as shown in FIG. 8. FIG. 6 shows the substrate being moved past stationary lasers 140 on a conveyer 150 in the direction of the arrows, although the substrate can be held stationary and the lasers moved instead, or a combination of movement of the substrate and movement of the lasers.

Figure 7:
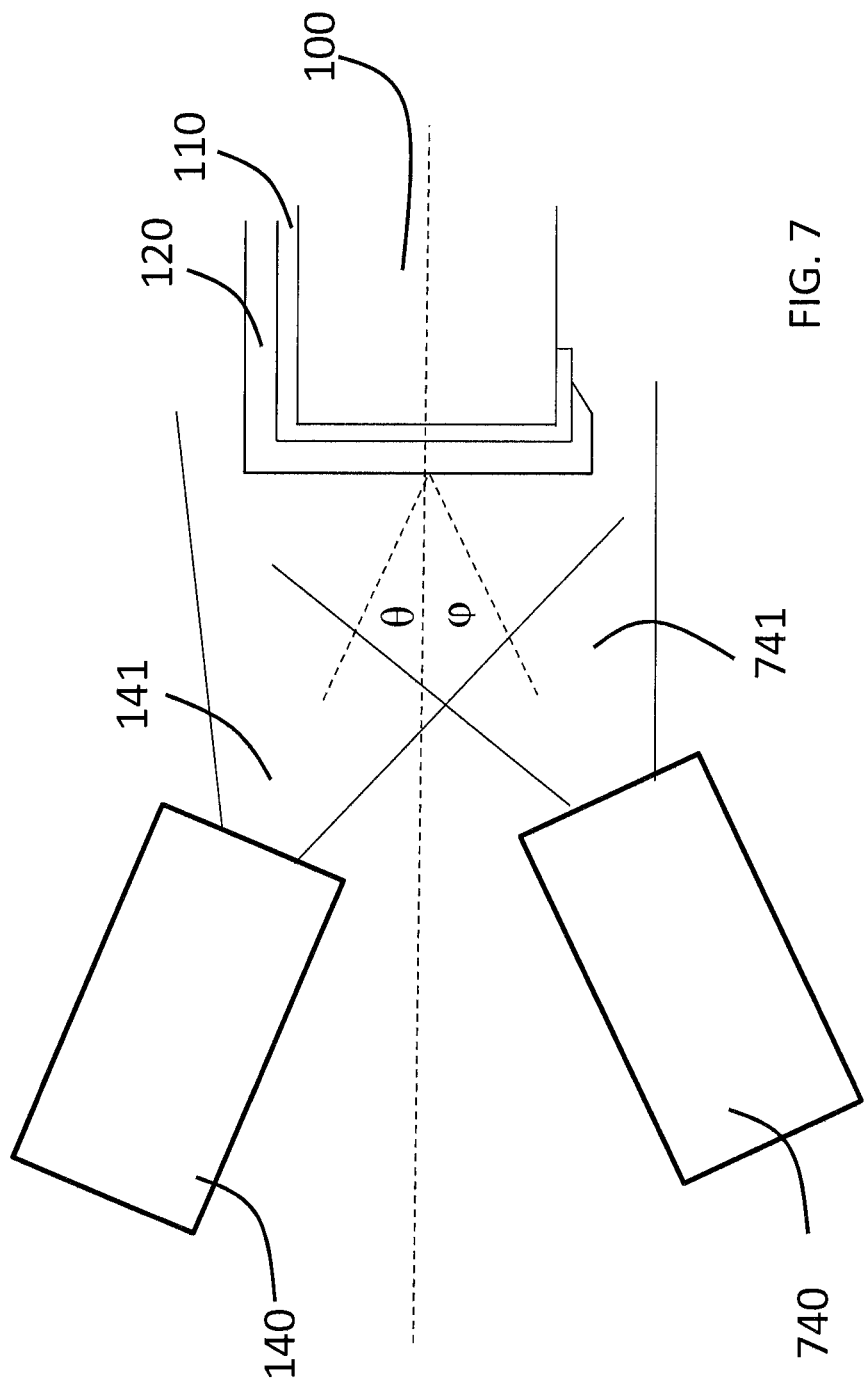
FIG. 7 shows a cross-sectional schematic of the irradiation of a side surface of the semiconductor layer with lasers oriented at angles above and below the horizontal plane, according to some embodiments of the present invention.

FIG. 7 shows a cross-sectional schematic of the irradiation of a side surface of the semiconductor layer with lasers oriented at angles above and below the horizontal plane, according to some embodiments of the present invention. IR laser 140 is shown generating a laser beam 141 to irradiate the side surface of semiconductor layer 120, deposited over porous silicon separation layer 110 formed on silicon substrate 100. Laser beam 141 is at an angle θ to a perpendicular to the side surface of the semiconductor layer, where typical ranges for θ are discussed above with reference to FIG. 5. Note that the angle θ is chosen such that the top edges and top corners of the porous silicon layer (where porous silicon top layer 111 meets porous silicon side surface layers 112) are well irradiated along with the porous silicon side surface layers as the laser beam(s) move over the side surfaces of semiconductor layer 120. IR laser 740 is shown generating a laser beam 741 to irradiate the side surface of semiconductor layer 120, deposited over porous silicon separation layer 110 formed on silicon substrate 100. Laser beam 740 is at an angle φ to a perpendicular to the side surface of the semiconductor layer, where typical ranges for φ are discussed above with reference to FIG. 5. Note that the angle φ is chosen such that the bottom edges and bottom corners of the porous silicon layer (where porous silicon side surface layers 112 wrap over on to the backside of the silicon substrate) are well irradiated along with the porous silicon side surface layers as the laser beam(s) move over the side surfaces of semiconductor layer 120. In embodiments, laser(s) 140 at angle θ may be used for IR irradiation, in other embodiments laser(s) 740 at angle φ may be used, and in further embodiments both laser(s) 140 and laser(s) 740 may be used. Note that typically the laser beam divergence is less than 10 degrees, and in embodiments less than 5 degrees.

As mentioned above, in some embodiments the process as described with reference to FIGS. 4A, 4B, 5, 6 & 7 may be conducted without using an infrared absorbing material to initiate weakening/separation of the porous silicon separation layer.

According to some embodiments, methods for releasing the semiconductor layer from the sides, edges and corners of the porous silicon covered silicon substrate can utilize one or more IR laser beams scanned along the side surfaces, such that the beam(s) irradiate the porous silicon separation layer over the side surfaces, edges and corners of the substrate which are covered by the semiconductor layer. The speed of movement of the laser(s) may be varied—for example the inventors have found the following approach to be efficacious for release of the semiconductor layers: moving a laser slowly over a substrate corner onto a side surface of the substrate, followed by faster movement of the laser along the side surface between corners, and then slower movement of the laser across the corner at the end of the side surface. It was observed that a higher IR dose and dose rate was required for releasing the semiconductor layer from the substrate corners than for release along the middle of a side surface.

FIG. 8 shows a schematic representation of a tool set for infrared laser irradiation of the device of FIGS. 4A & 4B for initiation of the separation of the semiconductor layer from the single crystal silicon substrate, according to some embodiments of the present invention. Substrates 400, such as shown in FIGS. 4A & 4B which have a semiconductor layer on a porous silicon separation layer which is to be released from a substrate by IR irradiation for initiation of the separation process, are provided to the tool set at module 810, which may be a SMIF (standard mechanical interface) or similar, or may be directly connected to a production line such as shown in FIG. 11. The substrates 400 are transported through the modules as shown by the arrows—transport may be by conveyor, robot or similar mechanism. The module 820 is configured with two lasers 140 for simultaneous IR irradiation of the side surfaces of the substrate 400, as described in more detail above with reference to FIG. 6. The substrates are then transported to module 830 for simultaneous irradiation of the other two side surfaces of the substrate. The modules 820 and 830 are positioned so as to require the substrate to be moved in a direction perpendicular to the movement past the pair of lasers on module 820 in order to move to module 830—this is one method for presenting the unirradiated sides to the lasers on module 830, although the modules 820 and 830 could have been arranged in a linear configuration and the substrate rotated through 90 degrees after processing by lasers on module 820 and before processing by lasers on module 830. Finally, processed substrates are transported to a module 840, which may be a SMIF or similar, or may be directly connected to a production line such as shown in FIG. 11.

Furthermore, for substrates with a different configuration, such as circular substrates or circular substrates with one or more flats, persons of ordinary skill in the art would be aware of modifications to the laser processing and tools illustrated by FIGS. 5, 6 and 8 following the teaching and principles of the present invention to accommodate the different substrate formats.

Figure 9:
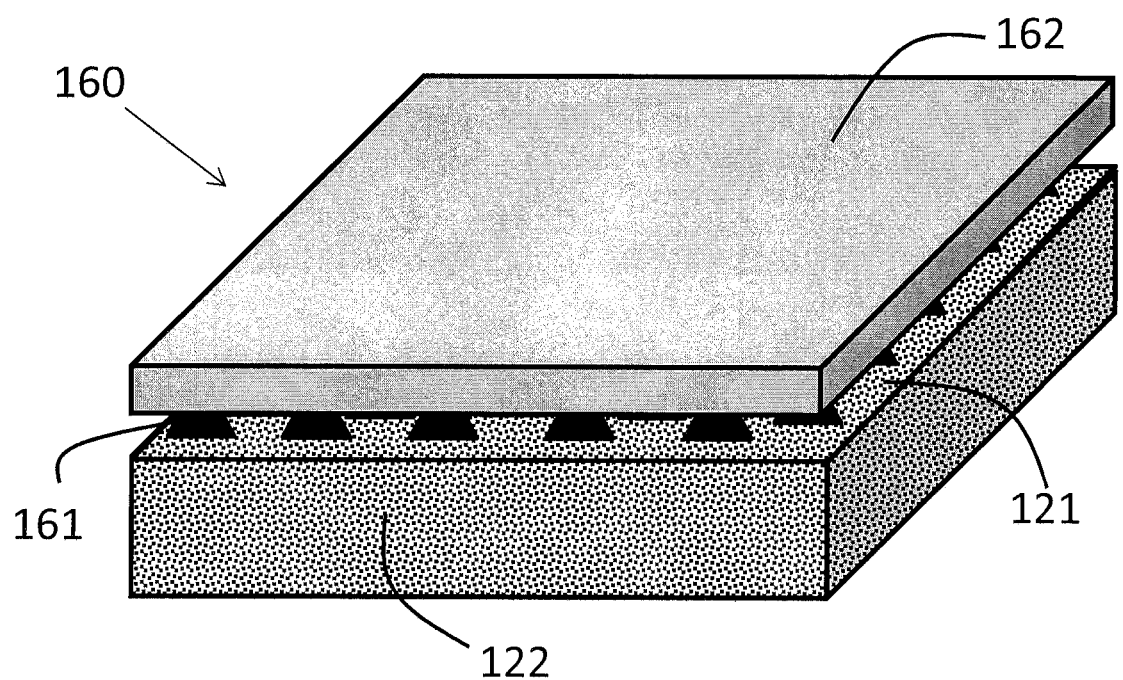
FIGS. 9 & 10 show representations of a tool, and the operation thereof, for separation of the semiconductor layer from the single crystal silicon substrate, according to some embodiments of the present invention.
Figure 10:
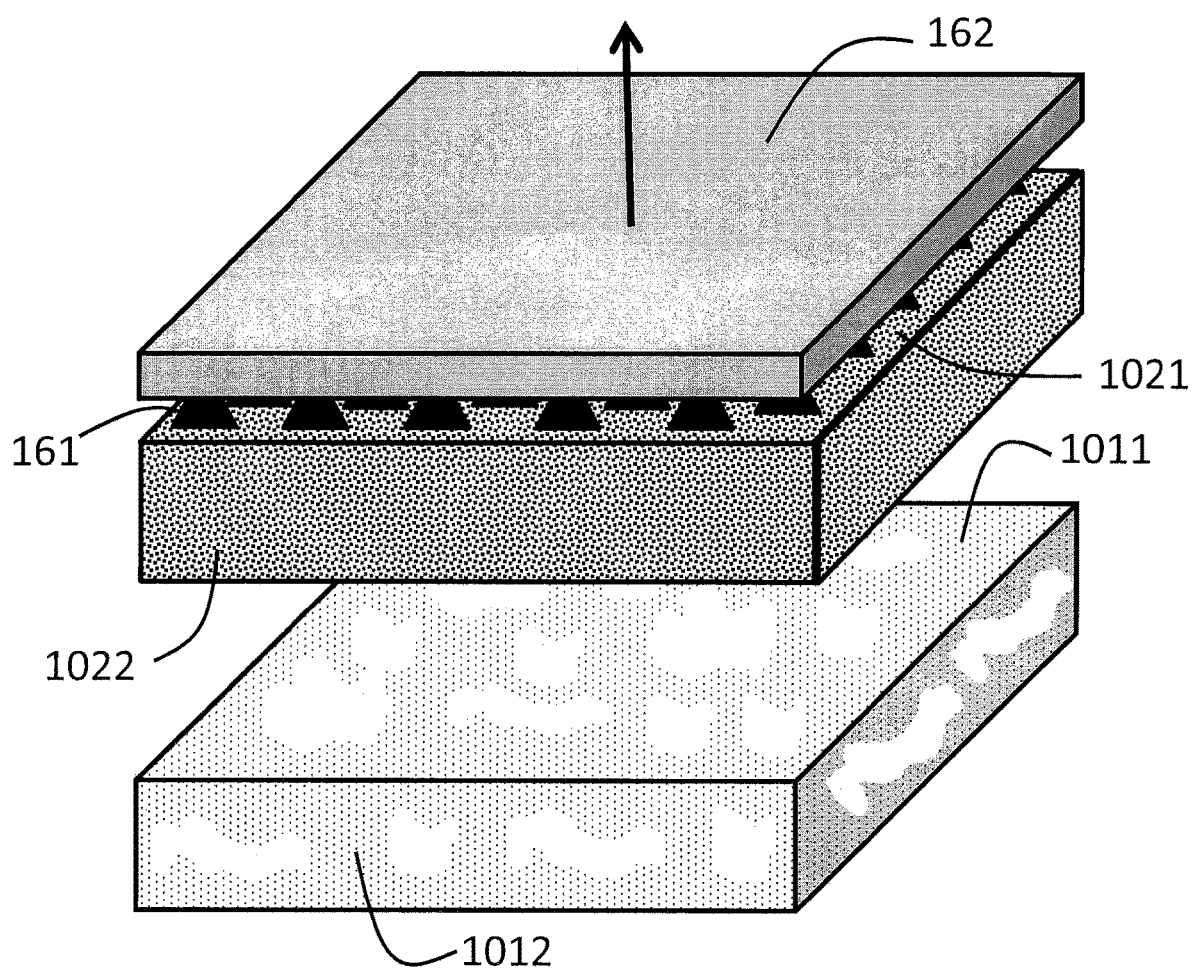

FIGS. 9 & 10 show representations of a tool, and the operation thereof, for separation of the semiconductor layer from the single crystal silicon substrate, according to some embodiments of the present invention. The mechanical separation of the semiconductor layer from the substrate in embodiments is by attaching a vacuum suction device to a top surface of the semiconductor layer and applying a force to the vacuum suction device roughly perpendicular to the top surface of the semiconductor substrate for pulling the semiconductor layer away from the silicon substrate. One example of such a vacuum suction device is described below with reference to FIGS. 9 & 10, although other tools may be used to implement the separation of the semiconductor wafer from the substrate—for example, a pick and place tool or a vacuum wand may be used instead.

FIG. 9 shows a vacuum suction device 160 comprising vacuum suction cups 161 attached to a stiff body 162. The suction cups are shown attached to the top surface of the semiconductor layer 121. Note that the process of IR irradiating the side surfaces of the substrate for initiating a separation of the semiconductor layer from the substrate, particularly along edges and corners, may on occasion result in the separation and even loss of the side surfaces of the semiconductor layer without further processing. In embodiments, the semiconductor layer 120 is released from the substrate along the sides, edges and corners of the substrate, and once the sides, edges and corners are released then the exfoliator separates the epitaxial layer fully from the substrate without damaging the substrate. Furthermore, a chemical clean can be used to remove remnant porous silicon from the substrate after separation.

FIG. 10 shows the vacuum suction device being moved vertically—perpendicular to the top surface of the substrate; semiconductor wafer 1021 has been separated from the substrate and is shown being held by the vacuum suction cups 161; separation of the semiconductor wafer may in some circumstances leave behind on the substrate the remnants 1011 of porous silicon top layer 111 and remnants 1012 of porous silicon side surface layers 112.

FIG. 11 shows a schematic of a process line according to some embodiments of the present invention. Tool 1110 receives a single crystal silicon substrate and forms a porous silicon separation layer over the top surface, all of the sides of the substrate, and overlapping the bottom edges of the substrate on to the back surface, as described above with reference to FIGS. 2 & 4B. Tool 1120 is a chemical vapor deposition reactor for depositing a single crystal epitaxial silicon layer over at least the entire top surface of the porous silicon separation layer, although not extending beyond the porous silicon separation layer on the side and back surfaces. Tool 1130 is an IR laser tool, such as described above with reference to FIGS. 5, 6, 7 & 8, for assisting in the releasing of the semiconductor layer by selective heating of the porous silicon separation layer under the semiconductor layer on the sides of the silicon substrate. Tool 1140 is a separation tool for removal of the semiconductor wafer in a single piece off the top surface of the silicon substrate—an example of such a tool is described above with reference to FIGS. 9 & 10. Tool 1150 is for cleaning any residual porous silicon off the semiconductor wafer and for laser trimming the semiconductor wafer to its final size, if required. Tool 1160 is a tool for cleaning any remnants of porous silicon off the surface of the silicon substrate, permitting the substrate to be used again—the cleaned substrate may be sent to tool 1110 for reuse. It is expected that the single crystal silicon substrates can be reused tens or even hundreds of times. Furthermore, in embodiments using infrared die, the die may be applied in tool 1130, for example using an applicator positioned alongside conveyor 150 positioned in front of lasers 140. (See FIG. 6.)

According to some embodiments, a method of fabricating a semiconductor wafer may comprise: providing a single crystal silicon substrate, the single crystal silicon substrate having top and bottom surfaces and at least one side surface, the single crystal silicon substrate having a porous silicon separation layer on the surface of the single crystal silicon substrate over at least the entire top surface of the single crystal silicon substrate and a semiconductor layer on the surface of the porous silicon separation layer, the semiconductor layer not extending beyond the porous silicon separation layer; irradiating at least a portion of the porous silicon separation layer with light with wavelength in the range of 1.5 microns to 11.0 microns to initiate a separation of the semiconductor layer from the single crystal silicon substrate; and mechanically separating the semiconductor layer completely from the single crystal silicon substrate. In embodiments, the providing may comprise: forming a porous silicon separation layer on the surface of a single crystal silicon substrate; annealing the porous silicon separation layer to form a single crystal silicon template on a top surface of the porous silicon separation layer; and epitaxially depositing by a chemical vapor deposition process an epitaxial layer of single crystal semiconductor material on the single crystal silicon template.

According to some embodiments, a system for separating a semiconductor wafer from a single crystal silicon substrate with a porous silicon separation layer may comprise: an irradiation tool for irradiating at least a portion of the porous silicon separation layer with light with wavelength in the range of 1.5 microns to 11.0 microns to initiate a separation of a semiconductor layer from the substrate; and a mechanical separation tool for mechanically separating the semiconductor layer completely from the substrate. Furthermore, in embodiments the system further comprises a conveyor for transporting the single crystal silicon substrate through the irradiation tool and the mechanical separation tool. Furthermore, in embodiments the system further comprises an applicator for the application of an infrared absorbing material to a portion of an exposed surface of the semiconductor layer.

FIG. 12 is schematic representation of infrared laser irradiation of a semiconductor layer for initiation of the separation of the semiconductor layer from a silicon substrate, according to a further embodiment of the present invention. Semiconductor top layer 1221 is deposited on a porous silicon separation layer 1210, the porous layer being formed on a silicon substrate 1200. An IR laser 1240 generates a laser beam 1241, providing IR radiation to an area 1242 of the semiconductor top layer 1221. Using the configuration of FIG. 12, the laser beam may be scanned over the semiconductor top layer as indicated by the arrows; alternatively, the substrate may be moved underneath a stationary laser beam; furthermore, both laser and substrate may be moved in order for the top surface to be irradiated. The laser 1240 is shown provided a laser beam roughly perpendicular to the semiconductor top layer, although irradiation at an angle, such as described above, may also be utilized in embodiments. The release mechanism is as described above—the IR radiation being strongly absorbed in the porous layer leading to a structural failure of the layer. Furthermore, irradiation of the top surface may be used in combination with the release processes described above, including the process described above with reference to FIGS. 9 & 10. Clearly, the irradiation of the top surface may be used in combination with irradiation of edges as described above, for release of semiconductor layers which extend beyond the top surface of the substrate.

Although embodiments of the present disclosure have been particularly described generally with reference to the formation and release of semiconductor layers such as epitaxial single crystal silicon layers on single crystal silicon substrates with a porous silicon separation layer, it is expected that other semiconductor layers can be formed and separated by the methods and equipment of the present invention. For example, the semiconductor layers may be silicon-germanium, germanium, gallium arsenide, aluminum gallium arsenide, silicon carbide (for example, 3C—SiC, amorphous silicon carbide and polycrystalline silicon carbide), sapphire, gallium nitride, etc. formed on a porous silicon covered single crystal silicon substrate.

Although embodiments of the present disclosure have been particularly described generally with reference to the formation and release of semiconductor layers such as epitaxial single crystal silicon layers on single crystal silicon substrates with a porous silicon separation layer, it is expected that other substrate layers can also be used. For example, in some embodiments the substrate can be germanium and/or silicon-germanium, etc., all of which can be anodized to form a porous separation layer on the substrate surface. Furthermore, single crystal silicon carbide substrates may be used, if highly doped, or single crystal silicon carbide substrates coated with an epitaxial layer of highly doped silicon carbide may be used, since a suitable porous silicon carbide release layer can be formed on the surface of highly doped silicon carbide. Furthermore, silicon carbide substrates may be formed by depositing amorphous or polycrystalline silicon carbide directly on silicon substrates, providing a separation layer can be formed in the amorphous or polycrystalline silicon carbide layer. These substrates may be used as templates for semiconductor materials such as silicon carbide, germanium, silicon-germanium, and any other materials that may be sufficiently closely lattice matched to the template; in embodiments, semiconductor layers formed of these materials maybe deposited and separated from the substrates following the principles and methods disclosed herein.

Although embodiments of the present disclosure have been particularly described with reference to certain embodiments thereof, it should be readily apparent to those of ordinary skill in the art that changes and modifications in the form and details may be made without departing from the spirit and scope of the disclosure.

What is claimed is:

1. A method of fabricating a semiconductor wafer, comprising:
   providing a single crystal silicon substrate, said single crystal silicon substrate having top and bottom surfaces and at least one side surface, said single crystal silicon substrate having a porous silicon separation layer on the surface of said single crystal silicon substrate over at least the entire top surface and at least a portion of the at least one side surface of said single crystal silicon substrate and a semiconductor layer on the surface of said porous silicon separation layer, including the at least one side surface in part, said semiconductor layer not extending beyond said porous silicon separation layer;
   applying an infrared absorbing material to a portion of an exposed surface of said semiconductor layer, the portion of the exposed surface being over the at least one side surface of the single crystal silicon substrate;
   irradiating at least a portion of said porous silicon separation layer with light with wavelength in the range of 1.5 microns to 11.0 microns to initiate a separation of said semiconductor layer from said single crystal silicon substrate; and
   mechanically separating said semiconductor layer completely from said single crystal silicon substrate, thereby fabricating the semiconductor wafer.

2. The method of claim 1, wherein said porous silicon separation layer extends continuously from said top surface to said at least one side surface of said single crystal silicon substrate and wherein said porous silicon separation layer extends at least partially over said at least one side surface of said single crystal silicon substrate.

3. The method of claim 2, wherein said semiconductor layer extends at least partially over the part of the surface of said porous silicon separation layer over said at least one side surface of said single crystal silicon substrate.

4. The method of claim 3, wherein said at least one side surface comprises two parallel surfaces, and wherein said irradiation is simultaneous laser light irradiation of said semiconductor layer over parts of said two parallel surfaces.

5. The method of claim 2, wherein said porous silicon separation layer extends completely over said at least one side surface of said single crystal silicon substrate, wherein said porous silicon separation layer extends continuously from said at least one side surface to said bottom surface of said single crystal silicon substrate, and wherein said porous silicon separation layer extends at least partially over said bottom surface of said single crystal silicon substrate.

6. The method of claim 5, wherein said semiconductor layer extends over the part of the surface of said porous silicon separation layer over said at least one side surface of said single crystal silicon substrate and wherein said semiconductor layer extends at least partially over the part of the surface of said porous silicon separation layer over said bottom surface of said single crystal silicon substrate.

7. The method of claim 6, wherein said at least one side surface comprises two parallel surfaces, and wherein said irradiation is simultaneous laser light irradiation of said semiconductor layer over parts of said two parallel surfaces.

8. The method of claim 1, wherein said irradiation is laser light irradiation incident at an angle in the range of 10 to 20 degrees to the perpendicular to a part of the surface of said semiconductor layer.

9. The method of claim 1, wherein said irradiation is laser light irradiation incident perpendicular to said top surface of said single crystal silicon substrate and wherein said irradiation is around at least a part of the edge of said top surface.

10. The method of claim 1, wherein said semiconductor layer has high optical transmittance for light with wavelengths in the range of 1.5 microns to 11.0 microns.

11. The method of claim 10, wherein said irradiating is through said semiconductor layer.

12. The method of claim 10, wherein said optical transmittance if greater than 90 percent.

13. The method of claim 10, wherein said optical transmittance if greater than 95 percent.

14. The method of claim 1, wherein said semiconductor layer is an epitaxial single crystal silicon layer.

15. The method of claim 1, wherein said irradiating is laser light irradiating.

16. The method of claim 15, wherein a beam diameter, measured at said porous silicon separation layer, of a laser used for said irradiating is in the range of 100 microns to 2 millimeters.

17. The method of claim 15, wherein said laser light irradiating is continuous wave laser light irradiating.

18. The method of claim 15, wherein said laser light irradiating is pulsed laser light irradiating.

19. The method of claim 15, wherein said irradiating is with light within a wavelength range is 1.9 microns to 2.1 microns.

20. The method of claim 15, wherein said irradiating is with light within a wavelength range is 1.9 microns to 6.0 microns.

21. The method of claim 15, wherein said irradiating is with light within a wavelength range is 4.9 microns to 6.0 microns.

22. The method of claim 15, wherein said irradiating is with light within a wavelength range is 9.0 microns to 10.5 microns.

23. The method of claim 1, wherein said irradiating is through said semiconductor layer.

24. The method of claim 1, wherein said irradiating is through said single crystal silicon substrate.

25. The method of claim 1, wherein said irradiating is by light generally perpendicular to any surface of said semiconductor layer.

26. The method of claim 1, wherein said irradiating starts at said infrared absorbing material and moves away from said infrared absorbing material.

27. The method of claim 1, wherein said infrared absorbing material comprises a material chosen from the group consisting of organic dye compounds and inorganic particulates.

28. The method of claim 1, wherein said mechanically separating is by attaching a vacuum suction device to a top surface of said semiconductor layer and applying a force to said vacuum suction device perpendicular to said top surface of said semiconductor substrate for pulling said semiconductor layer away from said silicon substrate.

29. The method of claim 1, wherein said portion of said porous silicon separation layer covers all edges of said substrate covered by said semiconductor layer.

30. The method of claim 1, wherein said portion of said porous silicon separation layer covers all corners of said substrate covered by said semiconductor layer.

31. The method of claim 1, wherein said providing comprises:
    forming a porous silicon separation layer on the surface of a single crystal silicon substrate;
    annealing said porous silicon separation layer to form a single crystal silicon template on a top surface of said porous silicon separation layer; and
    epitaxially depositing by a chemical vapor deposition process an epitaxial layer of single crystal semiconductor material on said single crystal silicon template.

32. The method of claim 1, further comprising, after said mechanically separating, reusing said single crystal silicon substrate, said reusing comprising:
    forming a porous silicon separation layer on said on the surface of a single crystal silicon substrate;
    annealing said porous silicon separation layer to form a single crystal silicon template on a top surface of said porous silicon separation layer;
    epitaxially depositing by a chemical vapor deposition process an epitaxial layer of single crystal semiconductor material on said single crystal silicon template; and
    mechanically separating said semiconductor layer completely from said single crystal silicon substrate.

33. The method of claim 1, wherein said semiconductor wafer is a circular wafer.

34. The method as in claim 1, wherein said semiconductor layer is an epitaxial single crystal silicon layer.

* * * * *